(12) United States Patent
Ling et al.

(10) Patent No.: US 8,450,046 B2
(45) Date of Patent: May 28, 2013

(54) METHODS FOR ENHANCING PHOTOLITHOGRAPHY PATTERNING

(75) Inventors: Moh Lung Ling, Singapore (SG); Gek Soon Chua, Singapore (SG); Qunying Lin, Singapore (SG); Cho Jui Tay, Singapore (SG); Chenggen Quan, Singapore (SG)

(73) Assignees: GLOBALFOUNDRIES Singapore Pte. Ltd., Singapore (SG); National University of Singapore, Singapore (SG)

( * ) Notice: Subject to any disclaimer, the term of this patent is extended or adjusted under 35 U.S.C. 154(b) by 959 days.

(21) Appl. No.: 12/392,093

(22) Filed: Feb. 24, 2009

(65) Prior Publication Data

US 2009/0214984 A1 Aug. 27, 2009

Related U.S. Application Data

(60) Provisional application No. 61/031,018, filed on Feb. 25, 2008.

(51) Int. Cl.
*G03F 7/30* (2006.01)
*G03B 27/72* (2006.01)

(52) U.S. Cl.
CPC . *G03F 7/30* (2013.01); *G03B 27/72* (2013.01)
USPC ............... 430/311; 430/313; 355/27; 355/53; 355/55; 355/67; 355/71

(58) Field of Classification Search
CPC ................................. G03F 7/30; G03B 27/72
USPC ................. 430/311, 313; 355/27, 53, 55, 67, 355/71, 77
See application file for complete search history.

(56) References Cited

U.S. PATENT DOCUMENTS

| 6,466,304 | B1 * | 10/2002 | Smith | 355/71 |
| 6,839,126 | B2 * | 1/2005 | Yen et al. | 355/68 |
| 6,977,387 | B2 | 12/2005 | Lee | |
| 7,537,870 | B2 * | 5/2009 | Crouse et al. | 430/30 |
| 7,790,525 | B2 * | 9/2010 | Prins et al. | 438/153 |
| 2007/0031744 | A1 * | 2/2007 | Crouse et al. | 430/30 |
| 2010/0002214 | A1 * | 1/2010 | Kim | 355/55 |

* cited by examiner

*Primary Examiner* — John Chu
(74) *Attorney, Agent, or Firm* — Horizon IP Pte. Ltd.

(57) ABSTRACT

A method for fabricating a semiconductor device that includes: providing a substrate prepared with a photoresist layer; providing a photomask comprising a first and a second pattern having a respective first and second pitch range; providing a composite aperture comprising a first and a second off-axis illumination aperture pattern, the first off-axis aperture pattern having a configuration that improves the process window of the first pitch range and the second off-axis aperture pattern having a configuration that improves the process window for a second pitch range; exposing the photoresist layer on the substrate with radiation from an exposure source through the composite aperture and the photomask; and developing the photoresist layer to pattern the photoresist layer.

17 Claims, 12 Drawing Sheets

(a)                 (b)                 (c)

150nm pitch

190nm pitch

200nm pitch

METHODS FOR ENHANCING PHOTOLITHOGRAPHY PATTERNING

FIELD OF THE INVENTION

The present invention relates generally to photolithography processes and in particular, photolithography processes that reduce fluctuations in critical dimensions of features imaged.

BACKGROUND OF THE INVENTION

The process of fabricating semiconductor devices requires the transfer of patterns present on a photomask onto a substrate where the semiconductor devices are to be formed. One method of transferring patterns is through photolithography. In a typical photolithography process, a layer of photoresist, a photosensitive material that changes its chemical composition as a result of light exposure, is deposited on a substrate. The photoresist is then selectively exposed in an exposure tool where a photomask containing patterns to be transferred is illuminated by light from a radiation source and an optical system in the exposure tool simultaneously projects all parts of the mask pattern onto the photoresist. After the exposure process, the photoresist is immersed in a developer so that the exposed parts of the photoresist remain or dissolve depending on the polarity of the photoresist used. The developing process leaves a photoresist pattern that is substantially similar to the mask pattern on the surface of the substrate.

An exposure tool used in a photolithography process typically consists of a radiation light source, an aperture, a condenser lens, a projection lens and a stage where the substrate is placed. The condenser and projection lens are typically optical systems comprising a plurality of lenses. During an exposure process, the photomask is placed between the condenser and projection lens. The radiation source, aperture and condenser lens form the illuminator portion of the exposure equipment which is used to illuminate the photomask. Lightwaves from the radiation source pass through openings in the aperture where it is thereafter collected by the condenser lens to form an illumination beam that is projected onto the photomask. When the illumination beam passes through the photomask, it is attenuated by the photomask. The attenuated illumination beam emerging through the photomask is known as an imaging beam and it is passed through the projection lens which form the optical portion of the exposure equipment. The projection lens is used to focus the mask pattern onto a substrate.

It has been observed that features with the same critical dimension on a photomask can be patterned onto a photoresist differently resulting in photoresist structures with different critical dimensions. FIG. 1 is a critical dimension (CD) versus pitch graph obtained by measuring the linewidth dimension of various photoresist structures formed from a series of line and space patterns on a photomask. The lines in the pattern have a common linewidth critical dimension of 45 nanometers (nm) on the photomask but are spaced from an adjacent line at varying pitches where each pitch is composed of a line and a space. In the example of FIG. 1, the structures are exposed with the numerical aperture of the projection lens set at 1.12 and using an off axis illumination aperture having an annular ring opening characterized by partial coherence factors, $\sigma_{in}/\sigma_{out}$=0.95/0.77.

Although the lines have a common linewidth dimension of 45 nm on the photomask, there is significant fluctuation in the photoresist critical dimension within the 150 nm to 200 nm pitch range. If the fluctuation in critical dimension is greater than the limit tolerated by device requirements the affected pitch range is referred to as the forbidden pitch. Forbidden pitches are undesirable as the critical dimension fluctuation prevents a circuit designer from being able to use the affected pitch range in his design.

A known method of mitigating the forbidden pitch problem is to selectively bias the CDs of the features on the photomask. For example, the dimensions of affected features can be scaled up or down so that the final linewidth dimensions formed in the photoresist are within the desired range. However, one of the problems with the biasing approach is that it is highly dependent on process parameters such as photoresist thickness, developer and exposure tools used.

Another method of mitigating the forbidden pitch problem is by adding scattering bar proximate the line features on a photomask. However, in tight pitch situation (for instance, in FIG. 1 the 190 to 220 nm pitch range), the space is too small for placement of scattering bars.

In view of the succeeding discussion, photolithography processes that mitigate the forbidden pitch effect are desirable.

SUMMARY OF THE INVENTION

The present invention relates generally to photolithography process and methods for manufacturing semiconductor devices that utilize these photolithography processes.

In one aspect of the invention, there is provided a method for fabricating a semiconductor device comprising: providing a substrate prepared with a photoresist layer; providing a photomask comprising a first and a second pattern having a respective first and second pitch range; providing a composite aperture comprising a first and a second off-axis illumination aperture pattern, the first off-axis illumination aperture pattern having a configuration that improves the process window of the first pitch range and the second off-axis illumination aperture pattern having a configuration that improves the process window for a second pitch range; exposing the photoresist layer on the substrate with radiation from a radiation source through the composite aperture and the photomask; and developing the photoresist layer to pattern the photoresist layer.

The first and second off axis illumination aperture patterns, for example, can belong to annular or dipole illumination mode. Other types of off axis illumination are also useful. A composite aperture in accordance with the prevent invention advantageously reduces or minimizes forbidden pitch effect by providing multiple off-axis illumination components with aperture pattern having a configuration that improves the process window for a plurality of pitches.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

In the drawings, like reference numbers generally refer to the same parts throughout the different views. Also, the drawings are not necessarily to scale, emphasis instead generally being placed upon illustrating the principles of the invention. In the following description, embodiments of the invention will now be described, by way of example with reference to the drawings of which:

FIG. 4a is a table showing the optimal $\sigma_{in}$ and $\sigma_{out}$ values for a line and space pattern having a target linewidth CD of 45 nm, wherein the patterns are exposed using an exposure aperture having the double annular aperture pattern of FIG. 3b;

FIG. 4b is a graph plotted based on the values shown in FIG. 4a;

DESCRIPTION OF THE INVENTION

Generally, the present invention relates to photolithography processes that reduce variability in critical dimensions of photoresist structures caused by differences in proximity to other features.

During an exposure process, the illumination beam can be projected onto a photomask from a number of different angles depending on the arrangement of the opening or openings on the aperture of an exposure tool. If aperture comprises an opening that is situated at the center of the aperture, the illuminating beam will be projected substantially along the optical axis, that is, the axis orthogonal to the condenser lens and photomask. This type of illumination is known as "On-axis illumination".

On the other hand, if the aperture is centrally obstructed and has one or more openings located off-center, the illumination beam is tilted projected onto the photomask away from normal incidence, in other words, at an angle to the optical axis. This type of illumination is referred to as "Off axis illumination" (OAI). OAI is often used as a resolution enhancement technique for optical projection lithography because tilting the illumination beam allows more first or higher diffraction order to be captured in the objective pupil plane. This has been known to lead to a better depth of focus performance.

Figure 2:
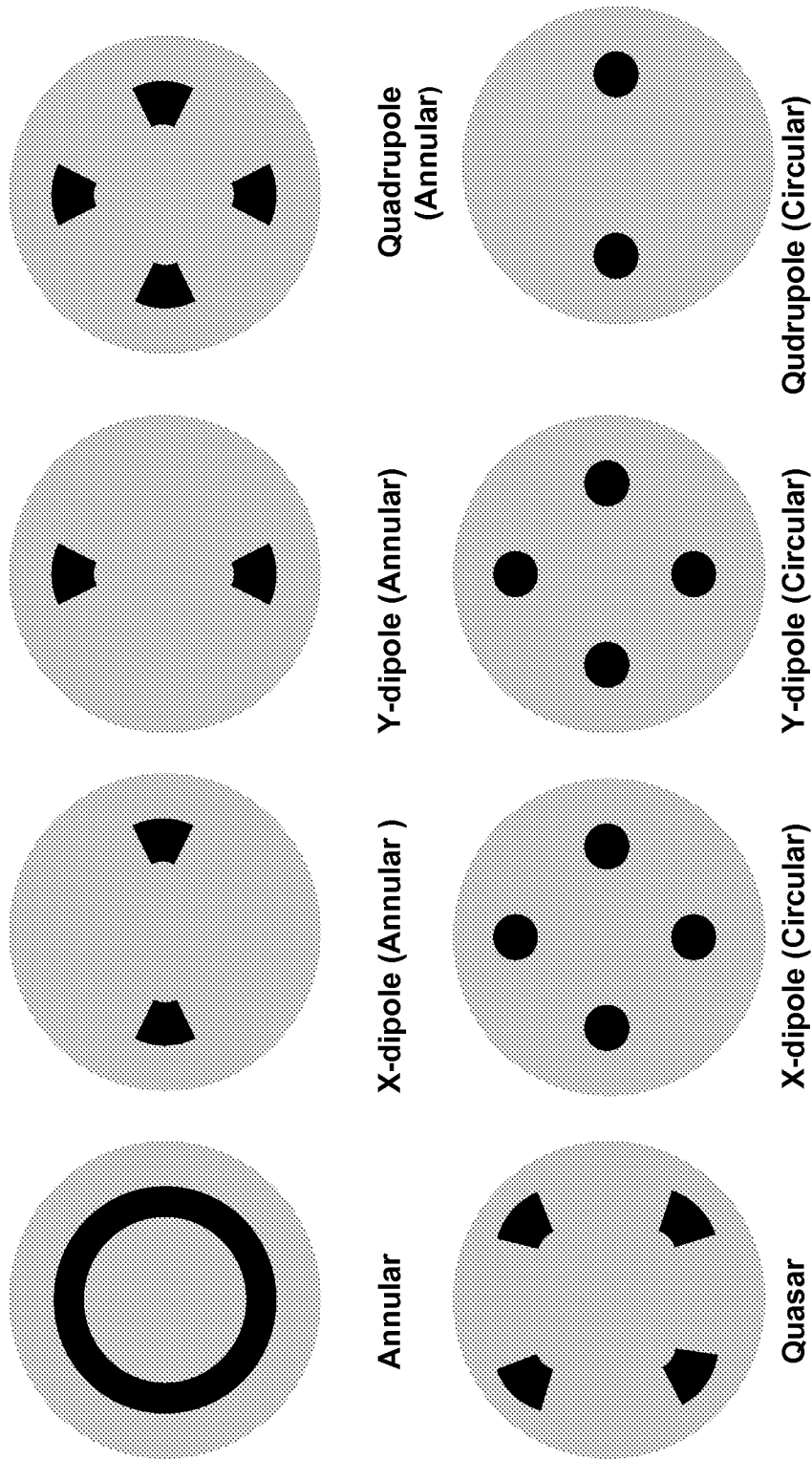
FIG. 2 shows a series of known off-axis illumination apertures.

FIG. 2 shows eight known OAI apertures where the openings are sized, positioned and/or shaped differently. The variation in the configuration of the aperture openings means that the eight exposure apertures shown in FIG. 2 will provide eight different illumination beam patterns. Some of the off axis illumination patterns shown in FIG. 2 belong to the same type of OAI mode but result in different illumination patterns being produced after light from a radiation source passes through the aperture due to way in which the openings are arranged. For example, the x-dipole and y-dipole aperture patterns both belong to the dipole type of OAI mode but different illumination patterns are generated because the openings in the x-dipole are oriented in the x direction while the openings in the y-dipole are oriented in the y direction. The type of OAI aperture pattern used in an exposure process may be varied between mask levels depending on the type of pattern being imaged. For example, annular and dipole aperture patterns are typically used for line and space patterning whereas quadrupole and quasar aperture patterns are often applied when the patterning of openings such as contact holes, interconnect openings and trenches are involved. It is to be appreciated that the present invention is not limited to being used in conjunction with the OAI aperture patterns shown in FIG. 2 but may also be applied to OAI apertures where the openings are differently positioned, shaped and/or oriented.

While OAI techniques can be used to improve the print quality of dense features, it often also has the drawback of exhibiting the earlier described forbidden pitch effect. This is undesirable because if the forbidden pitch effect is not reduced, the pitch range that can be patterned in a single exposure process will be limited. As a result, circuit designers will have less flexibility in their design because they have to avoid using structures that fall within the forbidden pitch range.

Figure 1:
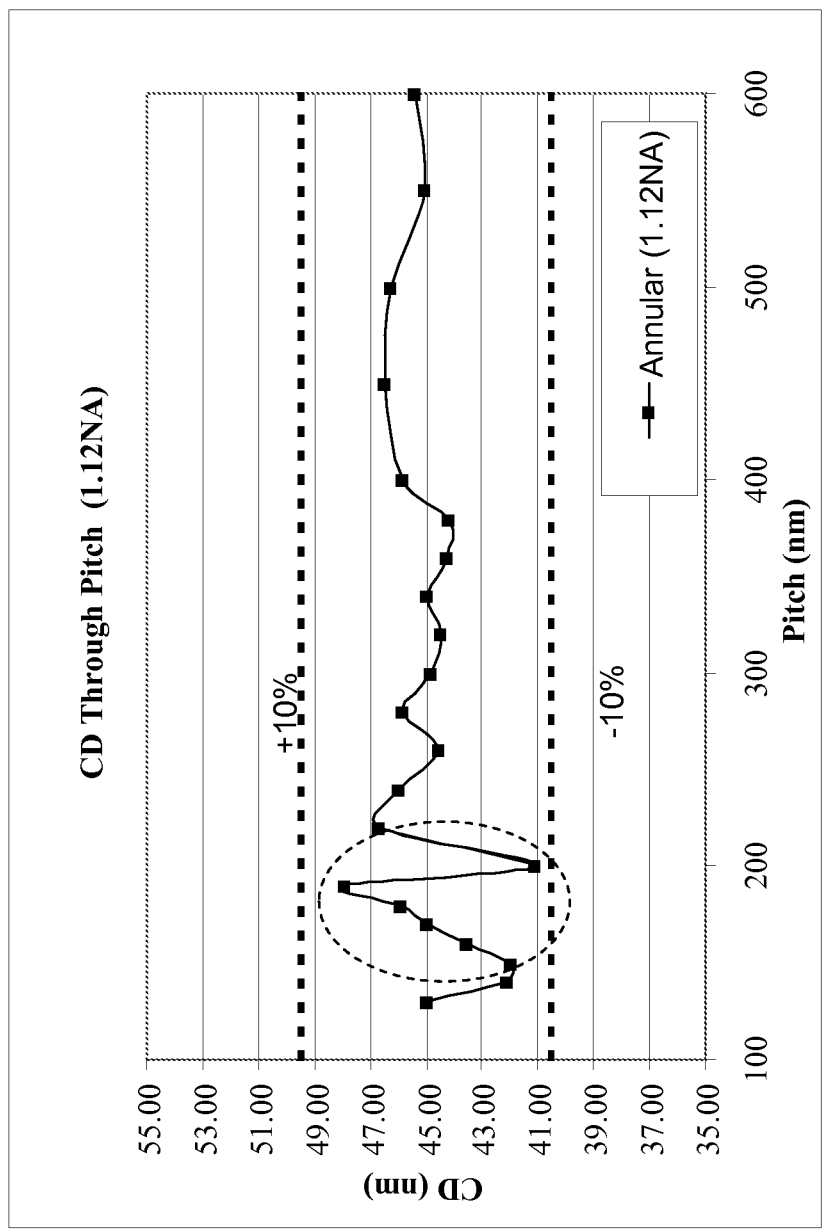
FIG. 1 shows a critical dimension versus pitch graph for a series of line and space patterns wherein the patterns are exposed using an exposure having conventional annular illumination pattern.

The inventors have discovered that when OAI settings are optimized to a single pitch value such that the process window at this pitch is a maximum, there is a greater likelihood for the forbidden pitch effect to occur. At the optimized pitch, the zero and first order diffraction are distributed evenly or symmetrically about the center of the pupil plane in the projection lens, resulting in improvement in image contrast and depth of focus at the optimized pitch. However, such a OAI setting can lead to the diffraction orders for other pitches being distributed unevenly about the center of the pupil plane. Where the uneven distribution of diffraction order in the pupil plane for a particular pitch has resulted in significant optical path difference between each order at the wafer plane, the image contrast at this affected pitch will degrade significantly thus causing a significant critical dimension variation from the design value. For example, in the critical dimension (CD) versus through pitch curve of FIG. 1 where the OAI aperture settings are optimized to the 130 nm pitch, significant CD fluctuation is observed in the 150 to 200 nm pitch range thus making the affected range the forbidden pitch range.

In one aspect of the present invention, the forbidden pitch effect is mitigated by having OAI settings that are optimized for a range of pitches rather than for one specific pitch. Specifically, this is achieved by exposing a photoresist using a composite exposure aperture comprising multiple OAI aperture patterns. Each OAI aperture pattern is analogous to one off-axis illumination source. The configurations for the respective OAI aperture patterns are selected such that they are beneficial for different pitches or pitch range. In one embodiment, at least two of the OAI aperture patterns have different sigma $\sigma_{in}$ and $\sigma_{out}$ values.

A theoretical analysis to illustrate the concepts of the invention is provided below. It is to be appreciated that the analysis is just a possible postulation and is not intended to be limiting on the present invention.

For partially coherent imaging, the image can be calculated by summing the images arising from individual source points. Partial coherent imaging is described in, for example, Yeung et al., "Extension of Hopkins theory of partially coherent imaging to include thin film interference effects", Proceedings of SPIE Vol. 1927, 452-463, which is herein incorporated by reference for all purposes. At the image plane, the image intensity I(x,y) can be expressed as the following:

$$I(x,y) = \Sigma I_s(x,y) \quad (1)$$

$I_s(x,y)$ is the image formed due to a source point located at the illumination plane. Denoting the coordinates of the illumination at the entrance pupil plane as (f,g) where f and g are spatial frequencies in x and y direction normalized to the numerical aperture (NA) of the pupil. The electric field E(x,y) at the image plane is the inverse Fourier transform of the product of pupil function, optical transfer function of the lens system and the mask function. Image intensity can be obtained by the squared value of the electric field.

$$E(x,y) = \iint_{\sqrt{f^2+g^2} \leq 1} P(f,g)H(f,g)M(f-f_s, g-g_s)e^{i2\pi(fx+gy)}dfdg \quad (2)$$

$$I(x,y) = |E(x,y)|^2$$

In the Equation 2, there are several components:
(i) H(f,g) is the pupil function, where $$P(f,g) = \begin{cases} 1, & \sqrt{f^2+g^2} < 1 \\ 0, & \sqrt{f^2+g^2} > 1 \end{cases}$$

(ii) H(f,g) is the optical transfer function of the lens system
(iii) $M(f-f_s, g-g_s)$ is the mask function. It can be obtained by Fourier transform the complex valued transmission function of the mask in the spatial coordinates.

For simplicity, the magnification factor is assumed to be 1. In fact, the magnification factor is 0.25 for a conventional lithography system.

Imaging of One Dimensional Line and Space Mask Structure

Consider a one dimensional line and space structure of line width 1 and pitch p, the frequency spectrum of the mask M(f,g) can be expressed as:

$$M(f,g) = M(f) = \frac{l}{p}\mathrm{sinc}(fl)\sum_{n=-\infty}^{\infty}\delta\left(f - \frac{n\lambda}{pNA}\right)$$

From the above expression, it can be seen that the diffraction orders are located at spatial frequencies:

$$f = \frac{n\lambda}{pNA},$$

for any g since it is a one dimensional structure

The above analysis is for the case of coherent source point. As mentioned above, we can sum each source point in partial coherent illumination to get the image. For partial coherent imaging, there would be a shift in the diffraction order. Thus the diffraction orders resulted from a source point located at $(f,g) = (f_s, g_s)$ is located at $$f' = \frac{n\lambda}{pNA} - f_s$$

$$g' = -g_s$$

The mask function is then applied to Equation 2 for calculation of image intensity. To resolve a pattern, the pupil must capture at least two diffraction orders. If the diffraction order collected is located symmetrically about the pupil plane, the image would have infinite depth of focus because the path difference is independent of image plane. Consider a case when the source point is located at the x axis with spatial frequency $(f_s, 0)$, the condition for infinite depth of focus is such that:

$$f_s = \frac{\lambda}{2pNA}$$

For a simple illumination such as a circular dipole along the horizontal direction, the center of the pole, $\sigma_c$ can be determined as:

$$\sigma_c = f_s = \frac{\lambda}{2pNA} \quad (3)$$

In other cases, the partial coherence setting of the illumination should be determined according to $f_s$ taking into the consideration of the shapes of individual illumination. Thus, $f_s$ can be taken as starting point for illumination optimization.

As observed from the above derivation, the optimal dipole aperture configuration condition is dependent on pitch and it is obvious that for different pitch values, the optimal value varies. In the case where more than one pitch is imaged, it is possible that for larger pitch, there would be three-beam interference (when second order diffraction is collected) and hence the depth of focus is limited.

Consequently, an optimal setting for particular pitch might be the worst for some other pitch. This has caused the forbidden pitch phenomenon. Based on the discussion above, if source points that is optimal for individual pitches can be supplied to illuminate the mask, an improvement on through pitch critical dimension control should be expected due to better image contrast.

Figure 3:
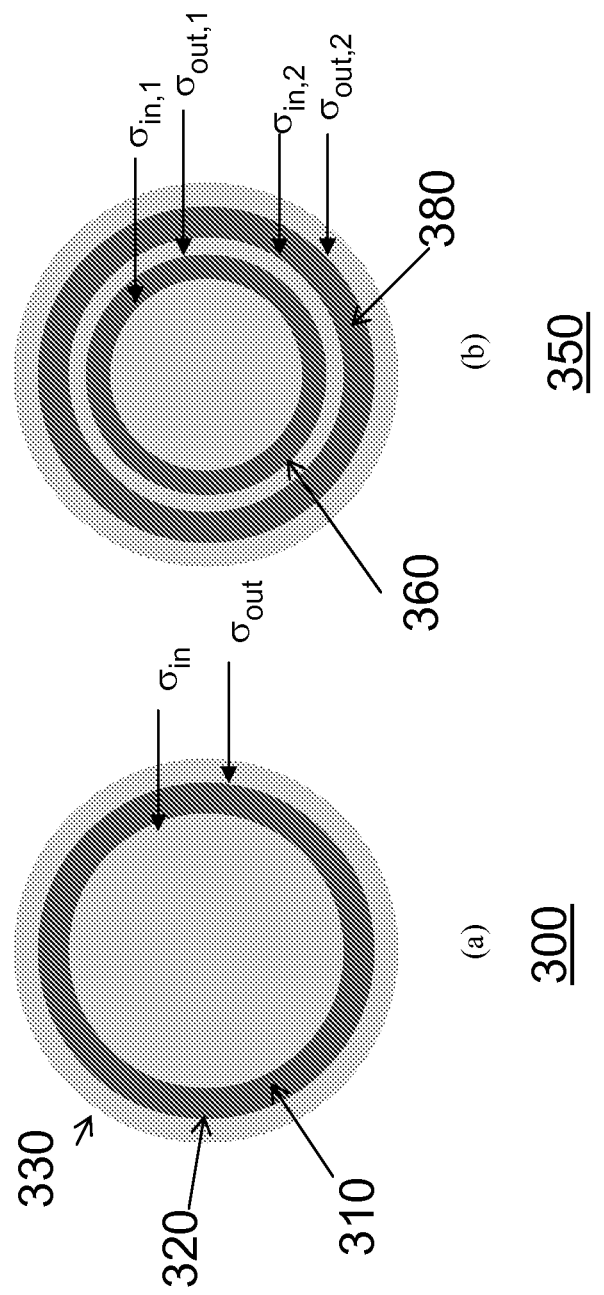
FIG. 3a shows a conventional annular illumination aperture.
FIG. 3b shows a double annular illumination aperture in accordance with one embodiment of the invention.

Annular illumination is commonly used for patterning line and space structures. It has the advantage of being circularly symmetric and therefore not dependant on the orientation of the exposure aperture. A conventional annular aperture 300 with a single annular ring is shown in FIG. 3a. A parameter commonly used to define the configuration of an annular aperture pattern are sigma_in ($\sigma_{in}$) and sigma_out ($\sigma_{out}$) where $\sigma_{in}$ refers to the sigma value of the inner circumference 310 and $\sigma_{out}$ refers to the sigma value of the outer circumference 320. Sigma value ($\sigma$) also referred to as a partial coherence factor is defined by a ratio of the numerical aperture of the illuminator portion of the exposure tool ($NA_{ill}$) to the numerical aperture of the projection lens ($NA_{proj}$) in the exposure tool. Therefore, the value of σ is dependent on the $NA_{proj}$ of the projection lens in an exposure tool. For an annular illumination, the $NA_{ill}$ of the illuminator portion and hence sigma value is also correlated with the radius of the respective inner and outer circumference (310, 320) that define the boundaries of the annular ring 330.

In one embodiment of the present invention as shown in FIG. 3b, a modified annular illumination aperture 350 with two concentric annular openings (360, 380) is used to mitigate the forbidden pitch problem. The inner circumference of the inner annular ring 360 has a sigma value of $\sigma_{in,1}$ and the outer circumference of the inner annular ring 360 has a sigma value of $\sigma_{out,1}$. Meanwhile the inner circumference of the outer annular ring 380 has a sigma value of $\sigma_{in,2}$ and the outer circumference of the outer annular ring 380 has a sigma value of $\sigma_{out,2}$. The $\sigma_{in}$ and $\sigma_{out}$ values of the inner and outer annular rings (360, 380) are chosen to improve the process window of a respective first and second pitch range of a line and space pattern formed on a photomask, wherein the photomask will be exposed using the modified annular aperture 350.

The design for the modified annular aperture in FIG. 3b may be obtained using a simulation software such as lithocruiser by ASML. In one embodiment, the simulation software can be programmed to derive optimal annular aperture configurations (i.e. $\sigma_{in}$ and $\sigma_{out}$ values) based on the criteria of providing the widest process window for the respective pitch. Parameters suitable in assessing process window include but are not limited to one or more of image fidelity parameters such as depth of focus (DOF), exposure latitude which is the maximum exposure dose variation permissible while still maintaining line critical dimension within acceptable limits, and image contrast parameters such as normalized image log slope which is a measurement of the slope at the edge of a resist profile. In one embodiment, the process window may be defined by a weighted combination of two or more image fidelity parameters.

In one embodiment, the software may simulate the patterning of a one dimensional line and space pattern with pitch values ranging from 130 nm to 500 nm and a target linewidth critical dimension of 45 nm. During the simulation, the other exposure conditions such as but not limited to $NA_{proj}$ of the projection lens, type of lithography system and photomask design are kept constant. The simulation software then derives optimal $\sigma_{in}$ and $\sigma_{out}$ values characterizing the annular ring for each pitch. In one embodiment, the simulation is performed based on an immersion lithography system, attenuated phase shift mask with 6% attenuation factor and $NA_{proj}$ of the projection lens equal to 1.12. Alternatively, other exposure conditions may also be used during the simulation.

FIG. 4a is a table showing the results of the above-described simulation. The optimal $\sigma_{in}$ and $\sigma_{out}$ values for a 45 nm line with pitch values ranging between 130 to 500 nm is shown in the table and also plotted in the corresponding graph FIG. 4b. As consistent with Equation 3 discussed earlier in the text, the results show that optimal partial coherence or sigma ($\sigma_{in}$ and $\sigma_{out}$ values) is pitch dependant. In general, larger pitch sizes have optimal source points nearer the center of the aperture, i.e. small σ setting while optimal source points for denser pitches are located towards the outer edge of the exposure aperture thus corresponding to a larger partial coherence setting.

After the optimal $\sigma_{in}$ and $\sigma_{out}$ values are derived, they are then divided into two or more sets based on how the values are distributed. For the example illustrated in FIGS. 4a and 4b, the optimal $\sigma_{in}$ and $\sigma_{out}$ values for the pitch range being studied can be broadly grouped into two sets of values. Each set of values corresponding to the settings for one of the annular illumination ring components in the modified illumination pattern. For example, the inner annular and the outer annular rings (360, 380) in the double annular aperture of FIG. 3b.

After determining the number of OAI components needed, the actual $\sigma_{in,1}/\sigma_{out,1}$ and $\sigma_{in,2}/\sigma_{out,2}$ values for each annular ring is chosen based on considerations such as but not limited to range of pitches to be covered by the ring, background noise and image contrast. In one embodiment, the σ values for each annular ring are selected such that all the optimal points for each pitch of interest are covered. However, if the pitch range of interest is wide, this may not be possible because the resulting annular ring required may be too wide or too many rings are required thus leading to excessive background noise which causes poor image contrast and hence image degradation. Therefore, the effect of background noise has to be considered when selecting the σ values for the annular aperture components/patterns and how many annular aperture patterns to include. In one embodiment where a wide pitch range is being patterned, only points around a critical pitch value or lower pitch values are included. The remaining pitches can be compensated by other compensation methods such as scatter bar or other optical proximity correction techniques. Alternatively, values that are an average of the optimal σ value for the pitches may be chosen. In a further embodiment, only points that are around the optimal value for most pitches are selected.

Figure 4:
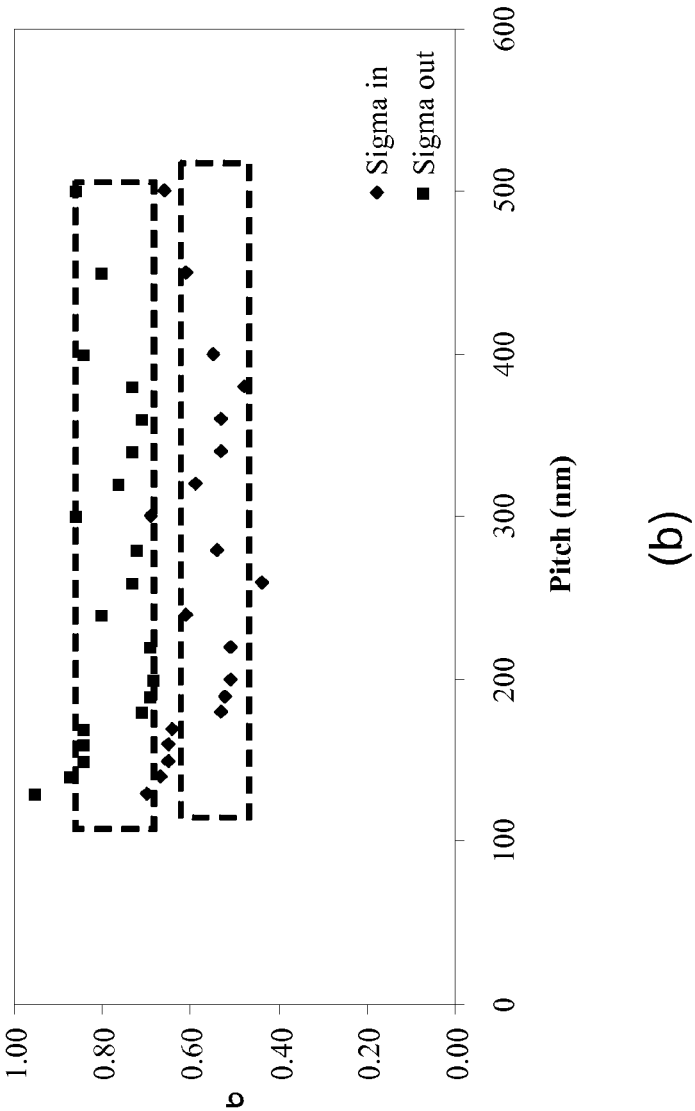

In one embodiment, the annular aperture pattern settings chosen based on the simulation results of FIG. 4 are $\sigma_{in,1}/\sigma_{out,1}=0.45/0.68$ and $\sigma_{in,2}/\sigma_{out,2}=0.70/0.95$. As observed from FIG. 4, optimal σ values for patterning 45 nm lines spaced at a tightest pitch of 130 nm are $\sigma_{in}/\sigma_{out}=0.70/0.95$. Therefore, the conventional method of providing an annular illumination ring with settings that are optimized for a single pitch of 130 nm will result in sigma values that do not cover or approach optimal values required for a large range of pitches denoted by points falling within the dotted rectangles. In accordance with one embodiment of the present invention, an inner annular illumination ring with $\sigma_{in,1}/\sigma_{out,1}=0.45/0.68$ is provided in the modified double annular aperture to encompass the pitches which are not accommodated by the single annular ring in a conventional illumination pattern optimized for the 130 nm pitch. The modified double annular aperture also includes an inner annular illumination ring with $\sigma_{in,2}/\sigma_{out,2}$ of 0.70/0.95 which are equivalent to the optimal values for the 130 nm pitch. Therefore, the present invention can be viewed as supplying additional off axis illumination sources in addition to what is provided for a single pitch.

While a double annular illumination is sufficient to provide optimal settings for the example being evaluated in FIG. 4, it is to be appreciated that the number of annular illumination rings in the present invention is not limited to two. A larger number of rings is also possible depending on the size of pitch range being patterned and if the values in the pitch range are clustered or spaced apart. Additionally, the annular rings in a modified annular aperture according to the present invention may also be of the same or different thickness.

Figure 5:
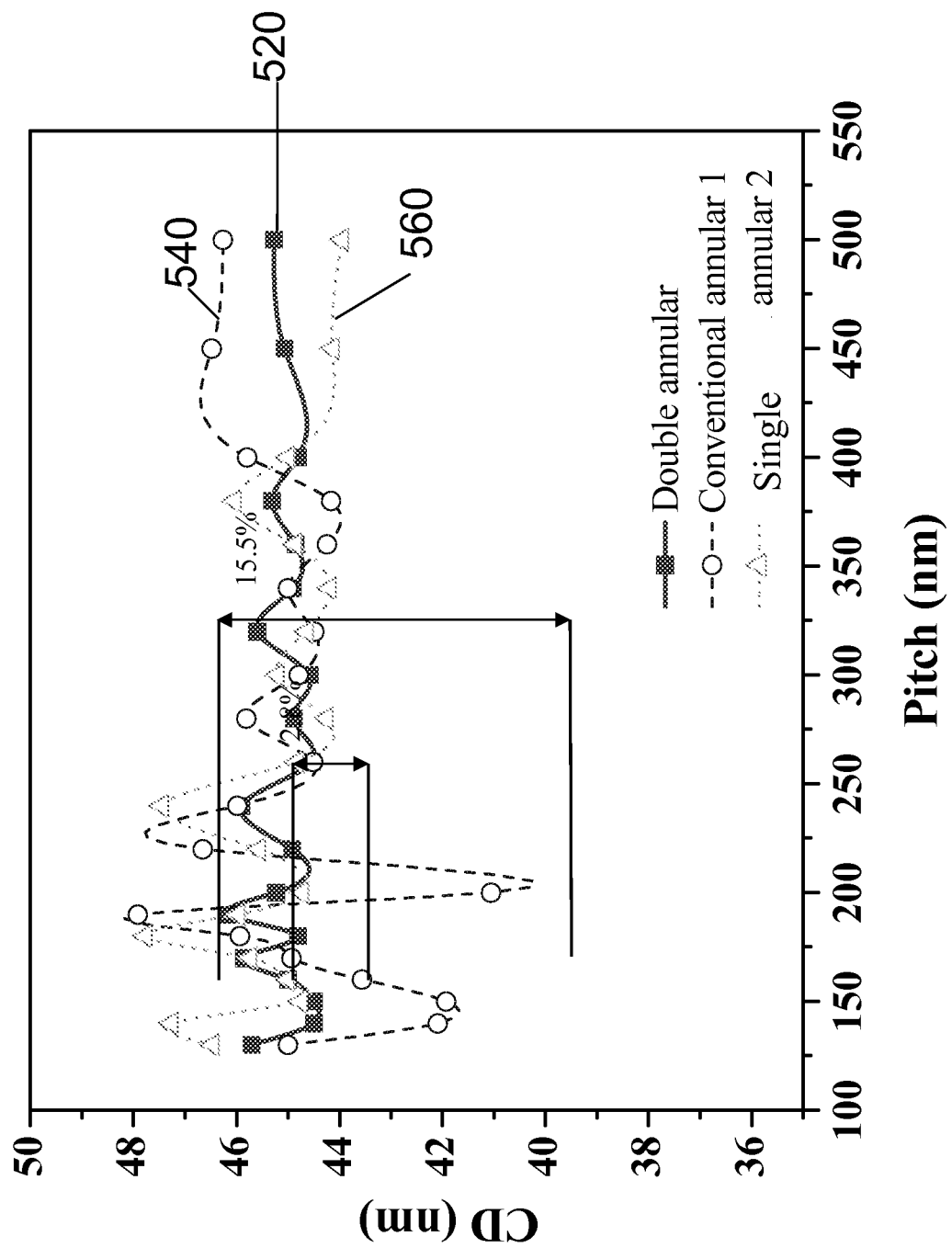
FIG. 5 is a graph showing the aerial image CD through pitch curves for two single annular apertures and for a double annular aperture in accordance with one embodiment of the invention.

The impact of the modified double annular illumination pattern derived from the above described simulation can be evaluated by observing its photoresist linewidth critical dimension (CD) through pitch performance. In FIG. 5, the CD through pitch performance for the modified double annular illumination is plotted together with the results for two exposure processes using the same exposure conditions but a single annular aperture pattern. Curve 520 in FIG. 5 is the aerial image CD through pitch behavior of the double annular illumination with $\sigma_{in,1}/\sigma_{out,1}=0.45/0.68$ and $\sigma_{in,2}/\sigma_{out,2}=0.70/0.95$. Curve 540 represents the aerial image CD through pitch behavior for a conventional annular with σ values that are optimal for 130 nm pitch that is, $\sigma_{in,2}/\sigma_{out,2}=0.70/0.95$. The $\sigma_{in,2}/\sigma_{out,2}$ values are identical to the settings for the outer annular ring in the double annular aperture. Curve 560 corresponds to the aerial image CD through pitch behavior of the inner annular ring in the double annular illumination pattern where $\sigma_{in,1}/\sigma_{out,1}=0.45/0.68$. The target CD for all the curves is 45 nm.

As illustrated in FIG. 5, the conventional annular ring 540 shows a large CD fluctuation in the 150 to 200 nm pitch range equivalent to 15.5% of the target CD. The minimum CD occurs at 200 nm pitch and is around 8.75% less than the target CD of 45 nm while the maximum CD occurs at the 190 nm pitch and is around 6.75% more than the target CD of 45 nm. The inventors have discovered that significant CD fluctuation is observed when the partial coherence settings $\sigma_{in}$ and $\sigma_{out}$ correspond to optimized values for the tightest pitch (130 nm) only and optimal illumination settings for other pitches being patterned are not taken into account. As a result, in the 150 nm to 200 pitch range, uneven diffraction order distribution on the pupil plane of the projection lens is not trivial leading to significant optical path difference between rays which causes low image contrast and CD fluctuation in said range.

Figure 6:
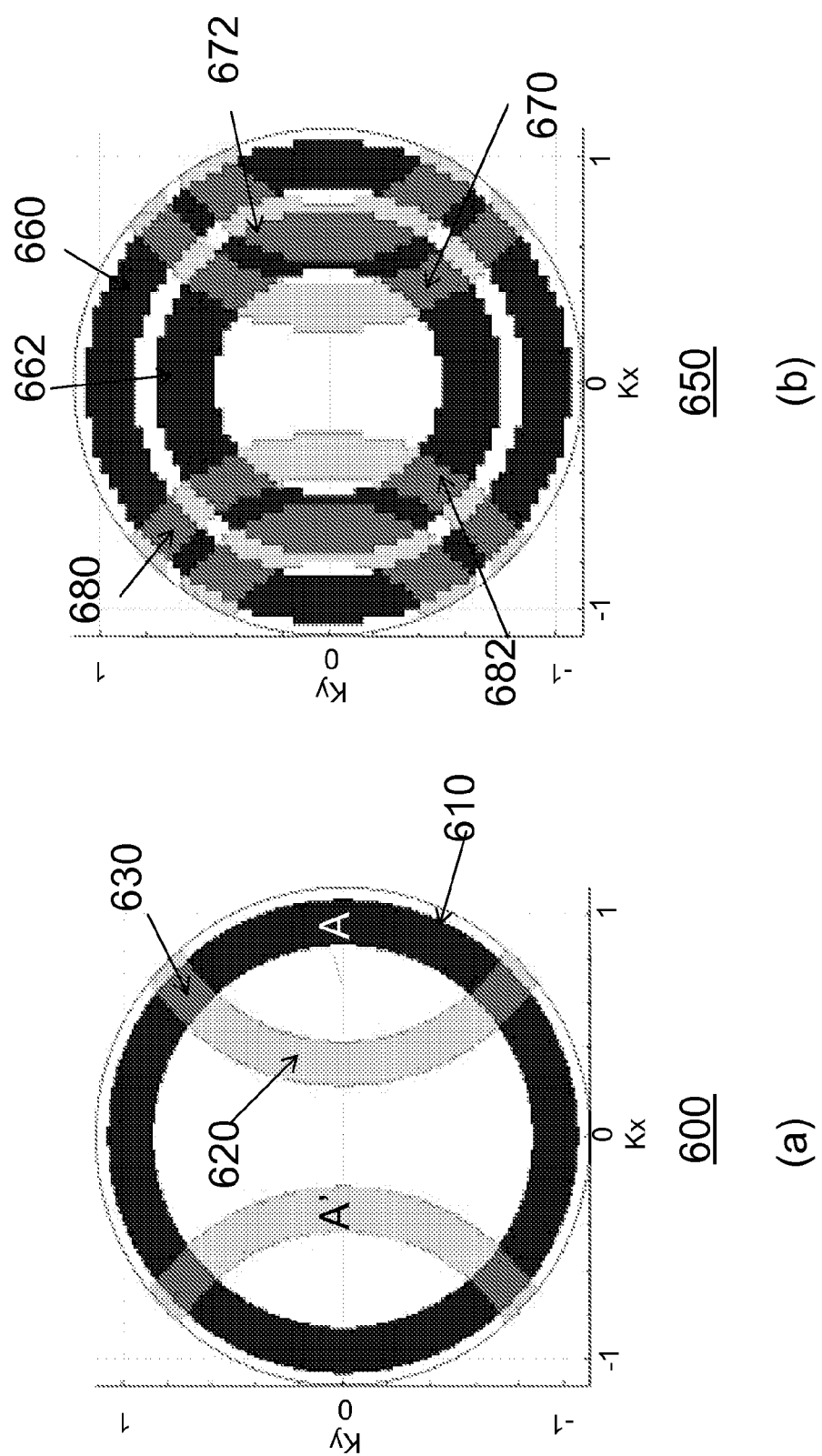
FIG. 6a shows the diffraction order at the pupil plane at a pitch of 150 nm when a conventional annular aperture with off-axis illumination aperture configuration optimized for a single 130 nm pitch is used.
FIG. 6b shows the diffraction order at the pupil plane at a pitch of 150 nm for a double annular aperture pattern corresponding to the curve 520 in FIG. 5.

Referring to FIG. 6a, the diffraction order distribution for the 150 nm pitch at the pupil plane is shown. The diffraction order corresponds to an exposure process where the photomask is printed using the conventional single annular ring aperture 540 with $\sigma_{in}/\sigma_{out}=0.70/0.95$. As the diffraction order distribution at the pupil plane will be reconstructed at the wafer or substrate plane, it affects the final image quality that will be obtained. Therefore, the diffraction order distribution at 150 nm pitch is an example to illustrate how a diffraction order distribution at a pitch with significant CD fluctuation would look like.

The diffraction order distribution in FIG. 6a comprises an annular ring 610 which represents the zero order diffraction distribution and two partial annular curves 620 which correspond to the portion of the first order diffraction from a neighboring source that is also collected by the pupil. For a point A located on the zero order, the corresponding first order point is located at A'. This means that the diffraction orders are asymmetrically distributed around the center of pupil plane which leads to an optical path difference between the rays emitted from A and A' respectively. The path difference causes degradation in image contrast.

In FIG. 6a, the first and zero order diffraction (610, 620) overlap to provide overlapping portions 630. In general, the inventors have discovered that the greater the extent of overlap between the first and zero order diffraction, the better the image contrast. This is because portions of the first order diffraction that are not overlapping with the zero order will become background noise thus degrading image contrast. For the example illustrated in FIG. 6a, there is large portion of first order diffraction 620 that is not overlapping with the zero order thus leading to significant degradation in image contrast at the 150 nm pitch. As a result, the CD deviation from the target value of 45 nm is significant at 150 nm.

In accordance with the invention, the image contrast at the 150 nm pitch can be improved by adding an additional inner annular ring to the single annular aperture 540 with $\sigma_{in}/\sigma_{out}=0.70/0.95$. In one embodiment, a double annular illumination pattern with an inner ring $\sigma_{in,1}/\sigma_{out,1}=0.45/0.68$ and outer annular ring with $\sigma_{in,2}/\sigma_{out,2}=0.70/0.95$ is provided. The additional inner annular ring compensates for background noise generated by the first order outer ring 620 by increasing the overlap between different diffraction orders. As a result, better image contrast and reduced forbidden pitch (i.e. CD fluctuation) effect is achieved. The diffraction order distribution 650 for 150 nm pitch lines exposed using the modified annular illumination pattern is shown in FIG. 6b. The exposure settings are as before with $NA_{proj}=1.12$.

In FIG. 6b, the outer annular ring 660 represents the zero order diffraction distribution for the outer annular ring with $\sigma_{in,2}/\sigma_{out,2}=0.70/0.95$ while the inner annular ring 662 represents the zero order diffraction distribution for the inner annular ring 660 with $\sigma_{in,1}/\sigma_{out,1}=0.45/0.68$. The two partial annular curves (the outer partial annular curve denoted by 670 and the inner partial annular curve denoted by 672), correspond to the portion of first order diffraction of a neighbouring source that is collected by the pupil. The first and zero order diffraction (660, 662, 670, 672) overlap to provide overlapping portions 680.

Although the non symmetrical diffraction order of the outer ring is still collected, as indicated by the presence of non-overlapping portions of the first order diffraction distribution (670, 672) in FIG. 6b, the extent of non-overlap has decreased compared to the diffraction distribution shown in FIG. 6a. This boosts image contrast and allows much better CD control at the 150 nm pitch. The addition of an inner annular ring also results in an improved image contrast and CD control at other pitches the diffraction order distribution of which are not shown. As a result, the forbidden pitch effect is reduced as evident from curve 520 in FIG. 5 which corresponds to the CD versus through pitch plot for the case when a substrate is exposed using the double annular aperture pattern. For curve 520, there is relatively uniform CD through pitch behavior with maximum deviation from target CD of 45 nm being only 2.8% of the target CD and the range of CD fluctuation through pitch is only 3%.

As for curve 560 which corresponds to a single annular aperture pattern exposure process with $\sigma_{in,1}$ and $\sigma_{out,1}$ settings identical to the inner annular ring of the modified double annular, there is still a significant amount of CD fluctuation compared to curve 520 for the double annular illumination. The maximum deviation being at 180 nm which is 6.13% above the target CD of 45 nm. Therefore, in contrast to both single annular apertures (540, 560) shown in FIG. 5, the modified double annular aperture 520 shows relatively uniform CD through pitch behavior.

Figure 7A:
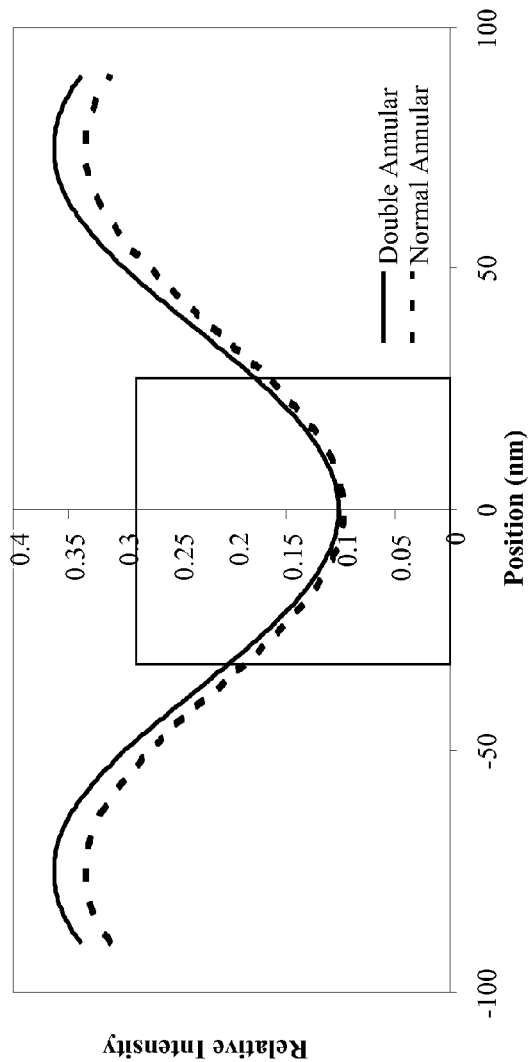
FIGS. 7a-7c show the pitch aerial image intensity plots at a pitch of 150 nm, 190 nm and 200 nm for a double annular aperture and a conventional annular aperture optimized for a single 130 nm pitch.
Figure 7B:
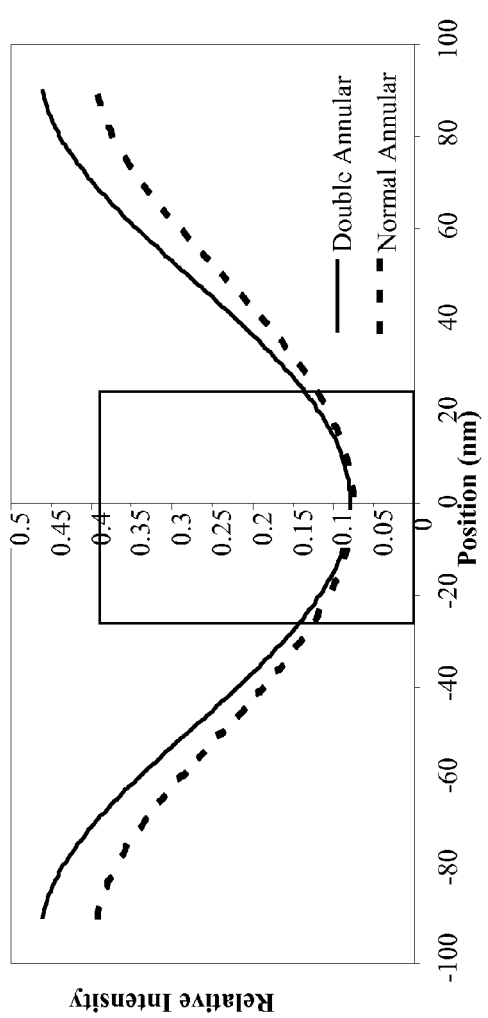
Figure 7C:
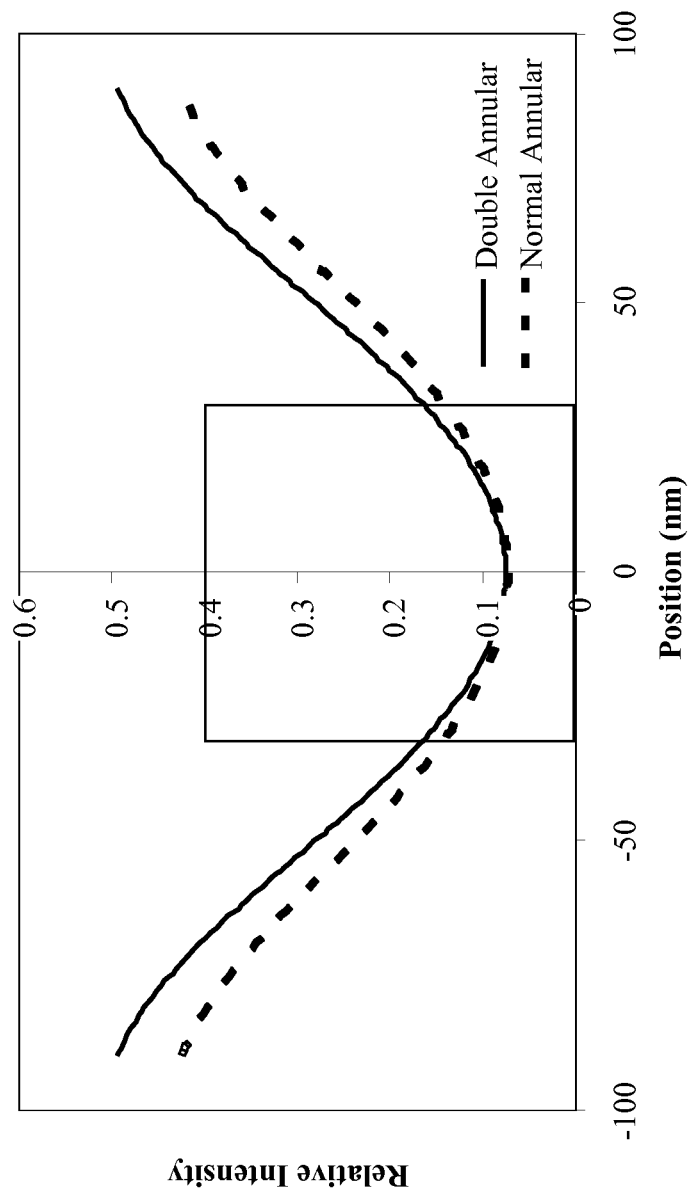

The performance of the modified double annular illumination pattern can also be observed from pitch aerial image intensity plots. FIGS. 7a-7c show the pitch aerial image intensity plots for the modified double annular illumination pattern (represented as solid lines) versus the conventional annular illumination pattern optimized for 130 nm pitch. The aerial image intensity plots are obtained by measuring the relative intensity for line and space patterns having a pitch of 150 nm, 190 nm and 200 nm respectively. A steeper slope corresponds to better image contrast and is therefore preferred. As observed from FIGS. 7a-7c, the double annular illumination pattern has relatively poorer image contrast for compared to the conventional annular illumination pattern all three pitches illustrated. This is inline with the observations in FIG. 5 where the conventional 130 nm optimized single annular aperture has much poorer CD control compared to the double annular aperture in accordance with the present invention.

As evident from the above example, it is possible to improve image contrast in the forbidden pitch region and produce a relatively uniform CD through pitch performance by using a modified OAI aperture pattern with two more OAI components or patterns arranged to provide optimized illumination settings for a range of values. The above example with double annular rings is for the purpose of illustrating an embodiment of the present invention and is not to be construed as limiting. Modifications may be made to the illumination pattern while applying the concepts of the invention. For example, the number of annular rings is not limited to two but may be varied to accommodate the pitch range to be optimized or if the pitch range to be optimized are spaced apart. The various rings may also have different thicknesses depending on the pitch range the ring is intended to provide optimized values for.

Figure 8:
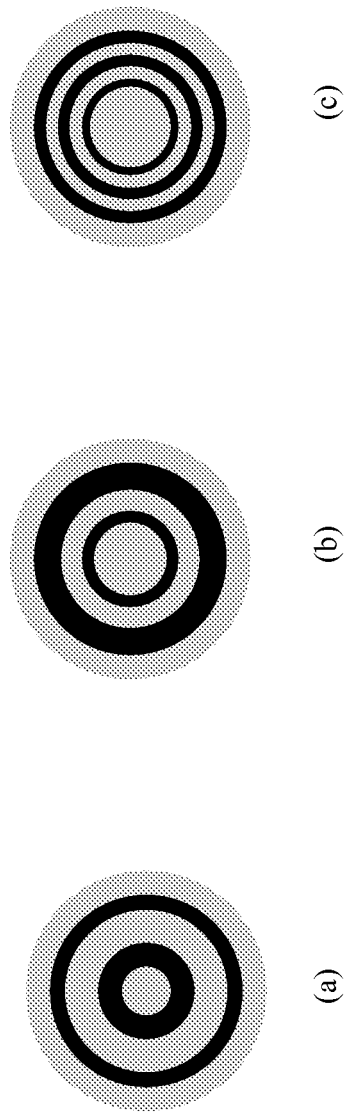
FIGS. 8a-8c show annular illumination aperture patterns in accordance with embodiments of the invention.

Some OAI apertures in accordance with embodiments of the present invention are shown in FIG. 8, FIG. 8a is a configuration for the double annular illumination that could be used if there is greater range to be optimized at the wider pitches therefore resulting in the inner ring being thicker than the outer one. FIG. 8b has a thicker outer ring for the imaging of a pattern that comprises a greater range of smaller pitches. FIG. 8c shows an illumination pattern with three rings which could be applied when the pitch range of a pattern is widely distributed.

In accordance with a second embodiment of the invention, a modified OAI aperture using dipole illumination mode is provided. Dipole illumination has the advantage of eliminating excessive background due to zeroth order and are supposed to exhibit relatively less CD through pitch fluctuation compared to annular illumination mode. In addition, better image contrast can also be achieved for features that are orientated perpendicular to the orientation of the dipole. For example, a dipole located along the x-axis provides excellent image contrast for line and space patterns directed along the y-axis. In view of the preceding advantages, dipole illumination is often applied during the patterning of dense line and space patterns. Nevertheless, the inventors realize that dipole illumination still suffers from the forbidden pitch problem.

Figure 9:
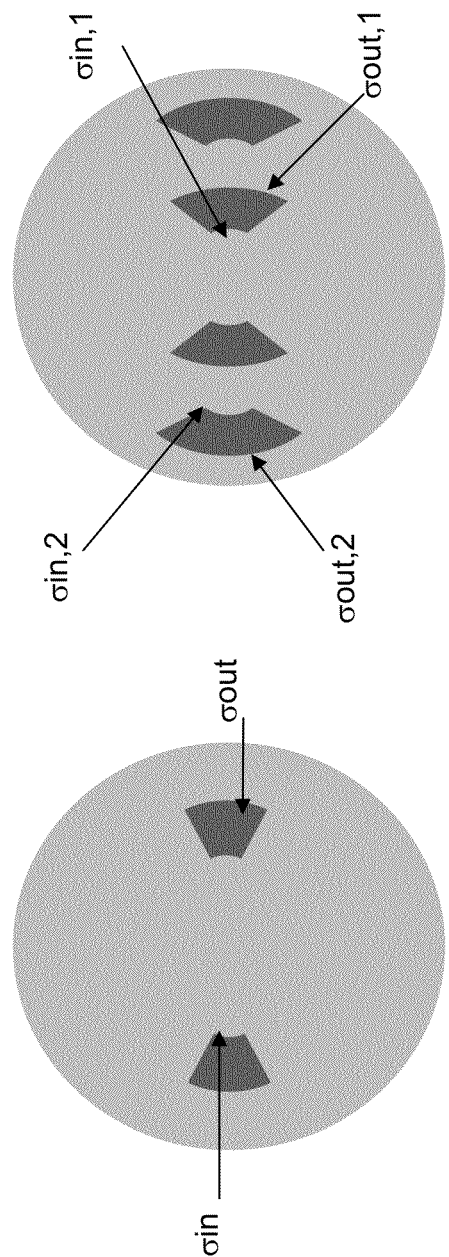
FIG. 9a shows a conventional x-dipole illumination aperture pattern.
FIG. 9b shows a double dipole illumination aperture pattern in accordance with another embodiment of the invention.

FIG. 9a shows a conventional dipole aperture pattern comprising one set of dipole openings located opposite each other along the x-axis. For line and space patterns having lines spaced at varying pitch, the optimum $\sigma_{in}$ and $\sigma_{out}$ settings vary depending on pitch. As a result, it is difficult to avoid situations where optimum $\sigma_{in}$ and $\sigma_{out}$ settings for a pitch causes poor image contrast for another pitch. Consequently, the forbidden pitch effect can still exist even for dipole illumination.

A modified dipole aperture pattern in accordance with another embodiment of the invention is shown in FIG. 9b. The modified dipole aperture pattern consists of two sets of dipoles and hence two sets of $\sigma_{in}$ and $\sigma_{out}$ values. The outer set of dipoles is optimized for dense pitch while the inner set of dipoles is configured to give better contrast for wider pitch. The additional inner dipole in the modified dipole illumination pattern increases overlapping between the zero and first order diffraction distribution, thereby improving image contrast. In alternative embodiments, there can be more than two sets of dipoles and the sets of dipoles need not be aligned along the same axis as in FIG. 9b but are oriented at an angle with respect to the other set or sets.

As with the previous example for annular illumination, the illumination settings for a modified double dipole may be derived by using a simulation software such as lithocruiser by ASML to calculate optimal settings of $\sigma_{in,1}$, $\sigma_{in,2}$, $\sigma_{out,1}$, and $\sigma_{out,2}$ for all pitches of interest. The simulation software can be programmed to derive optimal dipole aperture configuration (e.g. $\sigma_{in}$ and $\sigma_{out}$ values) based on the criteria of providing the widest process window for the respective pitch. Parameters suitable in assessing process window include but are not limited to one or more of image fidelity parameters such as depth of focus (DOF), exposure latitude which is the maximum exposure dose variation permissible while still maintaining line critical dimension within acceptable limits, and image contrast parameters such as normalized image log slope which is a measurement of the slope at the edge of a resist profile. In one embodiment, the process window may be defined by a weighted combination of two or more image fidelity parameters.

In one embodiment, the software simulates the patterning of a one dimensional line and space pattern with a target linewidth CD of 45 nm and pitch values ranging from 130 nm to 500 nm. During the simulation, the other exposure conditions such as but not limited to $NA_{proj}$ of the projection lens, type of lithography system and photomask design are kept constant. The simulation software then derives optimal $\sigma_{in}$ and $\sigma_{out}$ values characterizing the dipole configurations for each pitch. In one embodiment, the simulation is performed based on an immersion lithography system, attenuated phase shift mask with 6% attenuation factor and $NA_{proj}$ of the projection lens equal to 1.10. Alternatively, other exposure conditions may also be used during the simulation.

After the optimal $\sigma_{in}$ and $\sigma_{out}$ values are derived, they are then divided into two or more sets based on how the values are distributed. In one embodiment, a double annular illumination may be sufficient to cover the distribution of the optimal settings for a line 45 nm line with pitch between 130 nm to 500 nm.

Figure 10:
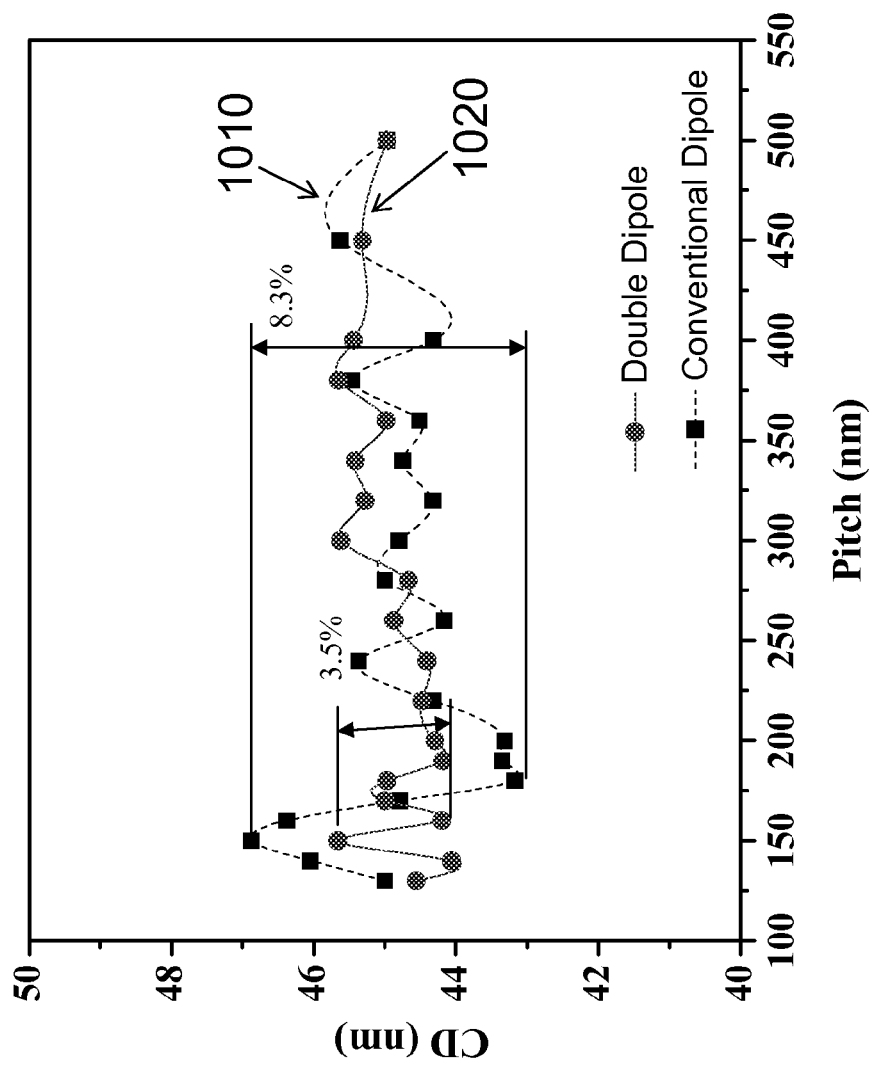
FIG. 10 is a graph showing the aerial image CD through pitch curves for a conventional dipole illumination aperture and a double dipole aperture pattern in accordance with one embodiment of the invention.

FIG. 10 shows the simulated CD through pitch performance for a conventional dipole with dipole aperture configuration of $\sigma_{in}/\sigma_{out}=0.45/0.68$ optimized for 130 nm pitch and a modified double dipole with dipole aperture configuration of $\sigma_{in,1}/\sigma_{out,1}=0.35/0.53$ for the inner dipoles and $\sigma_{in,2}/\sigma_{out,2}=0.58/0.70$ for the outer dipoles. As seen from FIG. 10, the conventional dipole illumination curve 1010 has relatively larger CD through pitch fluctuation particularly at pitch ranges between 150 to 200 nm. The difference between the maximum and minimum CD obtained is around 8.3% (from 150 to 170 nm pitch) of the target CD while the maximum CD occurs at 150 nm pitch with a deviation equal to 4.2% of the target CD. As with the earlier described annular illumination embodiment, CD fluctuation at the 150 to 200 nm range may be explained by uneven diffraction order distribution on the pupil plane leading to significant optical path difference between rays which causes low image contrast and depth of focus.

By contrast, performance of the modified double dipole aperture (represented by curve 1020) has significantly better CD through pitch performance. The range of CD fluctuation is much less with the difference between the maximum and minimum CD equal to around 3.5% of the target CD (at the 150 nm to 160 nm pitch). Additionally, the maximum CD deviation at 150 nm is only 1.4% of the target CD. Therefore, it is evident that an improvement in CD through pitch uniformity is achieved when the modified double dipole illumination is used during exposure. The improvement in CD through pitch uniformity for the modified double dipole aperture may be attributed in part to some portion of the additional inner dipole compensating for background noise generated by increasing the overlap between the zero and first diffraction orders.

Although a double dipole configuration is used in the above example, the invention also contemplates multiple dipole sets that are more than two. The number of dipole sets depending on the pitch range to be patterned and if the values of the desired pitches are closely or widely spread. Additionally, the thickness of each dipole set may also be different. Adjustment in the thickness can be done according to the pattern density to allow maximum benefit from this modification.

Figure 11:
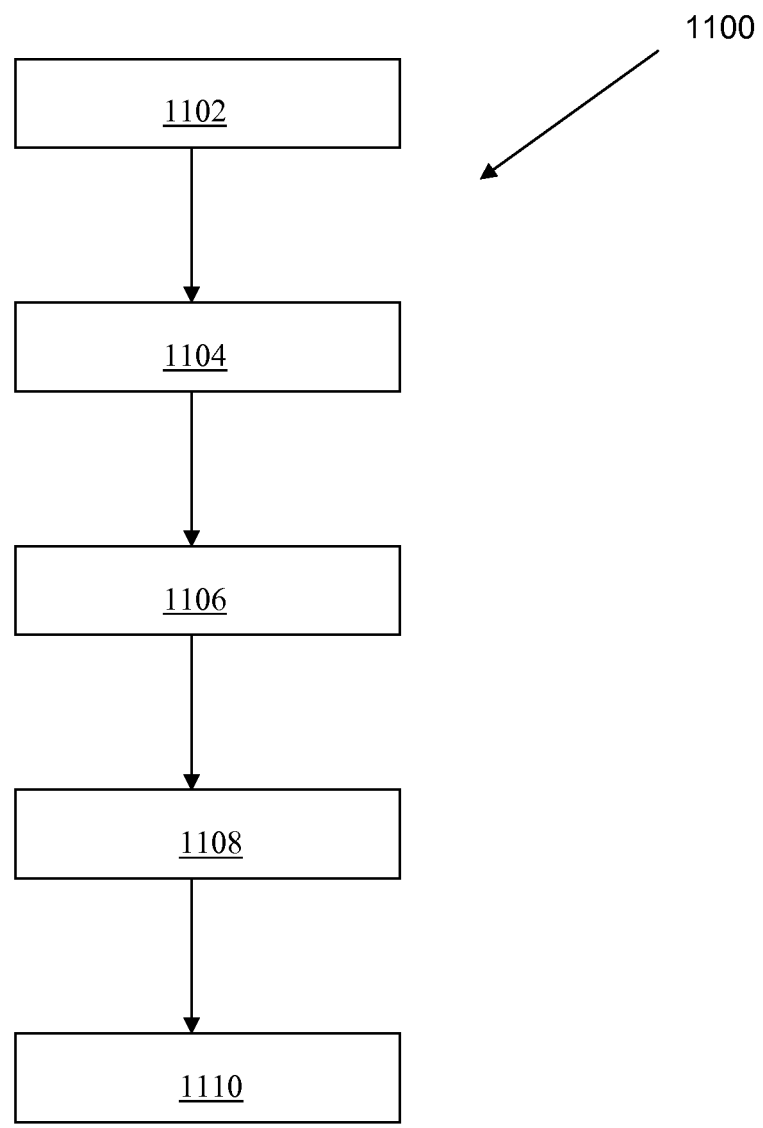
FIG. 11 is a flow chart of a photolithography process 1100 in accordance with an embodiment of the present invention

Referring now to FIG. 11, therein is shown a flow chart 1100 of a photolithography process 1100 in accordance with an embodiment of the present invention. The photolithography process includes providing a substrate prepared with a photoresist layer in block 1102. In one embodiment, the photoresist layer is applied onto the substrate by spin coating. A photomask comprising a first and a second pattern having a respective first and second pitch range is then provided in a block 1104. The photomask is disposed over the substrate and may be positioned by aligning it with respect to certain alignment features on the substrate. In one embodiment, the first and second patterns comprise line and space patterns. In another embodiment, the first and second patterns comprise a series of openings. In block 1106, a composite aperture comprising a first and a second off-axis illumination aperture pattern is provided. The first off-axis illumination aperture pattern having a configuration that improves the process window of the first pitch range and the second off-axis illumination aperture pattern having a configuration that improves the process window for a second pitch range. It is to be appreciated that the number of off-axis illumination aperture patterns is not limited to two with the actual number needed determined based on factors such as the range of pitch being optimized and how closely clustered the pitches are. Next in a block 1108, the photoresist layer is exposed to a radiation source to form an image of the first and second pattern on the photoresist layer. Radiation from the radiation source passes through in sequence the composite aperture and the photomask, where it is modulated before reaching the photoresist layer. The dose used in the exposure process may be sufficient to cause total phase change in the entire thickness of the photoresist layer thus pattern transfer from the photomask is completed in a single exposure step. Next, in a block 1110, the photoresist layer is developed thus patterning the photoresist layer. The photoresist may be developed using either wet or dry development.

The present invention provides modified off axis illumination patterns to address the forbidden pitch effect which is a common problem in the application of off axis illumination. The inventors have discovered that this problem can be attributed to different pitches requiring different optimal partial coherence or sigma σ settings. As a result, when the aperture pattern comprises a single OAI component whose configuration is based on the optimal value for a particular pitch, the forbidden pitch effect may occur. In the present invention, instead of having OAI aperture patterns that are optimized for just one particular pitch, additional OAI components are be added to an aperture pattern so as to improve pattern resolution at a range of pitches, wherein each of the respective OAI patterns corresponding to a component have a configuration that improves the process window of a respective plurality of pitches. The location of the OAI components, shape and dimensions thereof would vary depending on the pitches of interest and type of feature being printed. Further, although the described embodiments relate to the patterning of line and space patterns, the present invention is also applicable to the patterning of openings such as contact holes. Accordingly, the invention is also applicable to other OAI illumination modes such as but not limited to quadrupole and quasar illumination. Finally, although the OAI aperture patterns in the illustrated apertures belong to the same illumination mode, it is to be appreciated that the present invention also encompasses apertures where the OAI components belong to different illumination modes.

The described embodiments of the invention are illustrative of the invention rather than limiting of the invention. It is to be understood that revisions and modifications may be made to methods and systems described herein while still providing an invention that falls within the scope of the included claims. All matters hitherto set forth herein or shown in the accompanying figures are to be interpreted in an illustrative and non limiting sense.

What is claimed is:

1. A method for fabricating a semiconductor device comprising:
    providing a substrate prepared with a photoresist layer;
    providing a photomask comprising a first and a second pattern having a respective first and second pitch range;
    providing a composite aperture comprising first and second off-axis illumination (OAI) components, the first and second OAI components having respective first and second OAI aperture pattern, the first off-axis illumination aperture pattern having a configuration that reduces forbidden pitch effect of the first pitch range and the second off-axis illumination aperture pattern having a configuration that reduces forbidden pitch of the second pitch range;
    exposing the photoresist layer on the substrate with radiation from a radiation source through the composite aperture and the photomask; and
    developing the photoresist layer to pattern the photoresist layer.

2. The method as claimed in claim 1, wherein the first and second off-axis illumination aperture patterns belong to the same off-axis illumination mode.

3. The method as claimed in claim 2, wherein the first off-axis illumination aperture pattern comprises openings that are of a different thickness from openings associated with the second off-axis illumination aperture pattern.

4. The method as claimed in claim 3, wherein thickness of the off-axis illumination aperture pattern openings is denoted by difference between partial coherence values of an inner and outer circumference of the openings.

5. The method as claimed in claim 2, wherein the first and second off-axis illumination aperture patterns are oriented at an angle with respect to each other.

6. The method as claimed in claim 2, wherein at least one of the first and second off-axis illumination aperture pattern belongs to an annular, dipole, quasar or quadrupole illumination mode.

7. The method as claimed in claim 1, wherein the first off-axis illumination aperture pattern comprises openings that are of a different thickness from openings associated with the second off-axis illumination aperture pattern.

8. The method as claimed in claim 1, wherein at least one of the first and second off-axis illumination aperture pattern belongs to an annular, dipole, quasar or quadrupole illumination mode.

9. The method as claimed in claim 1, wherein the process window is defined by at least one of depth of focus, exposure latitude, and image contrast or weighted combinations thereof.

10. The method as claimed in claim 1, wherein during photoresist exposure, radiation from the exposure source is sufficient to cause a total phase change in the entire thickness of the photoresist layer, wherein the first and second pattern is transferred onto the photoresist layer in a single exposure step.

11. The method as claimed in claim 1, wherein the first and second patterns comprise line and space features.

12. The method as claimed in claim 1, wherein the first and second patterns comprise openings.

13. The method as claimed in claim 1, wherein the semiconductor device comprises an integrated circuit.

14. A method for fabricating a semiconductor device comprising:
   providing a substrate prepared with a photoresist layer;
   providing a photomask comprising first and second patterns having a respective first and second pitch range;
   providing an aperture comprising first and second illumination components having respective first and second illumination aperture pattern, wherein the first and second illumination aperture patterns belong to the same illumination mode, the first illumination aperture pattern further having a configuration that reduces the forbidden pitch effect of the first pitch range and the second illumination aperture pattern having a configuration that reduces the forbidden pitch effect of the second pitch range;
   exposing the photoresist layer on the substrate with radiation from a radiation source through the aperture and the photomask; and
   developing the photoresist layer to pattern the photoresist layer.

15. The method as claimed in claim 14, wherein the first illumination aperture pattern comprises openings that are of a different thickness from openings associated with the second illumination aperture pattern.

16. The method as claimed in claim 15, wherein thickness of the illumination aperture pattern openings is denoted by difference between partial coherence values of an inner and outer circumference of the openings.

17. The method as claimed in claim 14, wherein at least one of the first and second illumination aperture pattern belongs to an annular, dipole, quasar or quadrupole illumination mode.

* * * * *